United States Patent [19]

Stoelinga

[11] Patent Number: 4,591,753
[45] Date of Patent: May 27, 1986

[54] ELECTRON BEAM APPARATUS COMPRISING A WIRE SOURCE

[75] Inventor: Franciscus A. Stoelinga, Heemskerk, Netherlands

[73] Assignee: U.S. Philips Corporation, New York, N.Y.

[21] Appl. No.: 620,777

[22] Filed: Jun. 14, 1984

[30] Foreign Application Priority Data

Jun. 28, 1983 [NL] Netherlands ............ 8302275

[51] Int. Cl.⁴ ........................... H01J 1/18
[52] U.S. Cl. .................. 313/146; 313/149; 313/459
[58] Field of Search ........... 313/146, 149, 456, 457, 313/458, 459, 271, 278, 292, 346 DC

[56] References Cited

U.S. PATENT DOCUMENTS 3,290,540 12/1966 Atti .............................. 313/146
3,311,774 3/1967 Atti ........................... 313/149 X
3,364,373 1/1968 Atti .............................. 313/149
4,388,560 6/1983 Robinson et al. ............ 313/146 X

FOREIGN PATENT DOCUMENTS 54-105699 8/1979 Japan ........................ 313/146

Primary Examiner—David K. Moore
Assistant Examiner—K. Wieder
Attorney, Agent, or Firm—Paul R. Miller

[57] ABSTRACT

An electron beam apparatus comprises an electron source with an electron emitter in the form of a wire, suitably of metal, which slides on two supports. The two supports are constructed and spaced apart at such a distance (not more than 1 millimeter) that for the wire portion between the supports, a thermal equilibrium is achieved which is optimum for high electron emission from a small area of the wire. The wire can be heated to a temperature just below its melting point and is transported across the support under a low tensile stress.

15 Claims, 4 Drawing Figures

ELECTRON BEAM APPARATUS COMPRISING A WIRE SOURCE

The invention relates to an electron beam apparatus comprising an electron source with an elongate, thermal electron-emissive element which is to be locally heated and which is displaceable under tension in its longitudinal direction on two supports.

An apparatus of this kind is known from U.S. Pat. No. 3,290,540. An apparatus described therein comprises a metal tape which is intermittently transported between two supports. The tape may be made of a metal which can be made to emit electrons when it is suitably heated. The tape can alternatively act as a carrier for an electron-emissive substance.

For applications where an electron source having a high current density and a comparatively small emissive surface area is desired, for example for given electron microscopes, electron beam writing apparatus and the like, such a metal tape will be inadequate. The construction of the above-mentioned known electron source does not allow for a combination of a sufficiently small emissive surface area and a comparatively high current density for that emissive surface area. A portion of the metal tape which is present between the supports cannot be heated to a sufficiently high temperature for this purpose, certainly not if the supports are arranged at a distance from one another which is sufficiently small to achieve a small emissive surface area. Moreover, the construction and the transport mechanism of the known electron source do not allow for the use of a substantially narrower metal tape.

It is the object of the invention to mitigate these drawbacks; to this end, an electron beam apparatus of the kind set forth is characterized in that the two supports are spaced no more than approximately 1 mm apart and act as heat-dissipating elements determining the temperature balance for wire shaped electron emitter.

For a wire shaped emitter portion which is present between the supports in an electron beam apparatus embodying the invention, a thermal equilibrium occurs between, for example, the heat developed in said wire portion by, for example, an electric current, and the heat to be dissipated by the supports, so that at this area a comparatively small emissive surface area with a high current density can be sustained. The wire is preferably continuously advanced at a low speed; it may also be comparatively thin thanks to suitable local heat dissipation by the supports. The local heating can be effected by an auxiliary radiation source, such as a laser or an electron source or ion source, or by a filament current through the metal wire, which current is then preferably applied via the supports which act as cooling elements. Sliding contact between the metal wire and the supports exhibits suitable thermal contact and, if the supports also serve as heater current supply electrodes, also suitable electrical conductivity. At the areas of contact, the supports may consist of, for example, silver.

In an embodiment, notably in the form of a scanning electron microscope or an electron beam writing apparatus, the wire shaped emittor is a tungsten wire having a diameter of approximately 25 $\mu$m. The wire, that is to say the central portion thereof between the electrodes, is then heated to a temperature of, for example, approximately 3200° C., i.e. just below the melting temperature.

In a further embodiment, the electron beam apparatus comprises a rolling device for the wire which also acts as a suitably defined clamping device for the tensioning of the wire and for the suitable positioning of the wire with respect to the supports. The rolling device is capable of providing the wire, with for example, two flat surfaces having a width of about 10 $\mu$m to 30 $\mu$m prior to passing over the supports. From an electron-optical point of view, an improved emission pattern is obtained for the wire and also a better thermal and, if necessary, electrical contact with the supports.

For various applications of the source, rolling of the wire may be omitted or be performed in a separate rolling device. In that case use if preferably made of a cassette for the wire which can be simply transferred from the rolling device to the electron beam apparatus.

In order to keep the locally heated area of the wire at a constant emission temperature, a further preferred embodiment comprises an electronic control circuit which is controlled, for example by the total emission current of the wire or by a part thereof which is to be intercepted by an aperture. Notably in embodiments where the wire is heated by a heater current, the electronic control circuit may also be adapted to control a magnetic field near the emissive portion of the wire for realignment of the electron beam. Any deviations in the direction of an electron beam to be emitted due to a magnetic field produced by the heater current are thus compensated for. A measurement signal for the deviation of the beam with respect to the optical axis can be derived, for example, from an aperture which is divided into electrically isolated portions.

In a further embodiment, the control mechanism is also constructed for the intermittent heating of the wire, so that pulsed operation of the electron source is possible.

Some embodiments of the invention will be described in detail hereinafter with reference to the accompanying drawings. Therein:

FIG. 1 diagrammatically shows an electron beam apparatus embodying the invention in the form of an electron beam machining apparatus;

Figure 1:
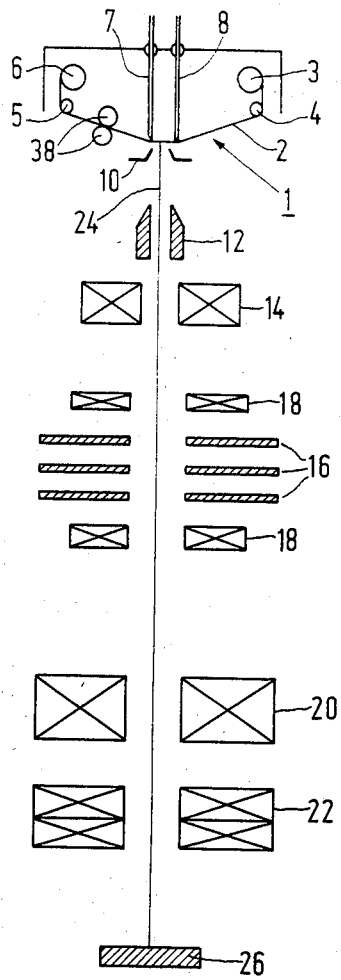
Figure 2:
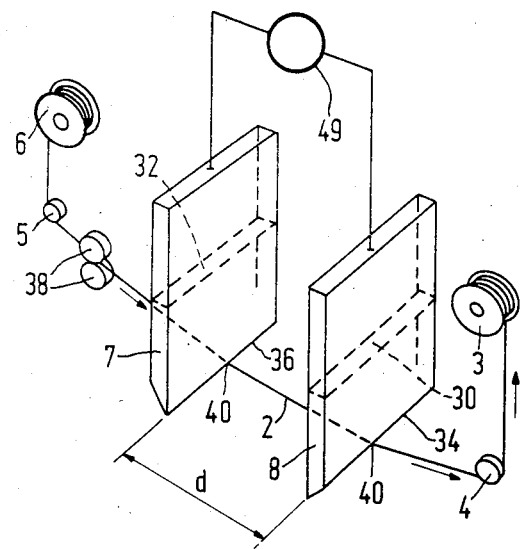
FIG. 2 is a more detailed representation of a wire cathode for such an apparatus.

The electron beam apparatus shown in FIG. 1 comprises an electron source 1 with a wire 2 which is unwound from a feed reel 6, and is wound via supporting rollers 5 and 4 and two supports 7 and 8 onto a take-up reel 3. The apparatus furthermore comprises a first anode 10, a second anode 12, a condenser lens 14, a lens system 16, a double beam alignment device 18, a lens system 20, and a beam deflection device 22. These successive electron-optical elements are capable of controlling and collimating an electron beam 24 generated in the electron source 1. Using the beam deflection device 22, the beam can be made to write a pattern on a target plate 26, for example in a silicon wafer such as in an electron beam writer. The supports 7 and 8 of the electron source, shown in greater detail in FIG. 2, are made of a suitably thermally conductive material, for example gold or silver. The cross-sectional areas 30 and 32 of the supports in a plane parallel to the wire 2 are comparatively large, for example, from 1 to 10 mm². Adjacent the wire 2, the supports have slightly rounded-off, tapered ends 34 and 36. For the sake of temperature resistance, heat transfer and thermal conductivity, the ends are made of a metal such as gold, silver, molybdenum, tungsten or the like. The desired erosion resistance of these contacts is thus also obtained. The described embodiment also comprises a rolling device 38 whereby a wire, for example an initially round wire having a diameter up from about 10 μm, is provided with substantially flat sides having a width dimension of from approximately 10 to 30 μm, said flat side thus extending parallel to the ends 34 and 36 of the supports. The rolling device 38 also provides a suitably defined clamping of the wire in order to maintain therein a tensile stress of, for example, approximately 0.01 newton by means of the driven take-up reel 3. The wire, being heated to a value in the vicinity of the melting temperature, does not allow for a substantially higher tensile stress. On the other hand, thanks to the high temperature the wire will be comparatively readily deformable at the area of the supports, so that suitable thermal contact with the supports is maintained during displacement. For even more exact positioning and better thermal contact and electrical conductivity, the supports may be provided with grooves which partly enclose the wire. These grooves can be formed, for example by impressing a cold wire having the desired profile partly into the end portions of the support which are made of, for example, silver. The wire is preferably pulled across each of the supports at an angle 40 in order to promote suitable mechanical contact between wire and supports. In order to minimize the deformation of the wire, this angle is maintained at a comparatively small value.

When, by passing the supports, direct metallic contact with the housing of the apparatus is avoided, the wire portions situated outside the supports can be prevented from carrying a current when the wire is not formed as a closed loop. The wire can also be isolated from the housing by introducing an electrical interruption between the wire and the housing near the guide rollers 4 and 5, near the reels 3 and 6 and possibly near the rolling device 38. To this end, use can suitably be made of an insulating, temperature-resistant material such as $Al_2O_3$ at these areas. This is very desirable notably for the elements which directly adjoin the supports. The construction of the electron source allows for the use of an even thinner wire, for example a wire having a diameter of 10 μm. The supports may then be arranged nearer to one another, accordingly for example at a distance of 0.25 mm against about 1.0 mm for thicker wires, and the heater current or another energy source used for the heating of the wire can be adapted to the cross-sectional area and the spacing of the supports. Thanks to this adaptation for the head dissipation capacity of the supports, an optimum thermal equilibrium can be obtained once more.

Beside pure metal wires such as wires made of tungsten or molydenum, use can alternatively be made of a wire which is made of an alloy of one of these metals, for example with rhenium, or with additions such as, for example, thorium or barium to a porous wire. The wire can also be made of carbon or a similar non-metallic material.

Figure 3:
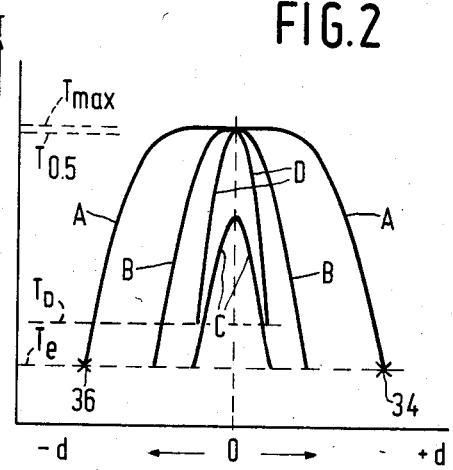
FIG. 3 is a graphic representation of the temperature variation across the wire for different distances between the supports.

FIG. 3 shows the temperature variation in the longitudinal direction of the wire when heated by means of a heater current between the supports. In this Figure the centre of this wire portion is situated over the horizontal axis point O. A curve A represents the situation where, in the case of a comparatively large distance 2d between the wire supports, a central portion of the wire has a substantially homogeneous temperature which decreases therebeyond to the temperature $T_e$ of the wire at the area of the supports 34 and 36. The central portion of the wire has a temperature of, for example, 3200° C. in the case of a tungsten wire, the supports having, for example, a temperature of 750° C. When the distance between the supports is reduced, for a given type of wire and a given desired temperature of the central portion the wire temperature will no longer exhibit a flat portion as from a given distance between the supports. This situation is represented by the curve B. When the distance 3d is further reduced, the wire will no longer reach the desired temperature in the centre; this is denoted by the curve C. When the heater current is increased in this situation, the desired temperature of the central portion can be reached again and the edges of the curve (the curve D in the figure) will be steeper; the wire then is adjusted automatically to a higher temperature at the aera of the supports. Thus, a short, more point-like emissive surface is obtained. It is to be noted that the half-value width of an electron emission curve measured in the longitudinal direction of the wire is situated at a temperature amounting to approximately 97% of the central temperature, so that it can be reached at a very small distance from the centre. The distance between the supports can be reduced to approximately 0.1 mm; this can lead to an emissive surface which is extremely small notably when use is made of a comparatively thin wire, for example with a diameter below 10 μm.

Figure 4:
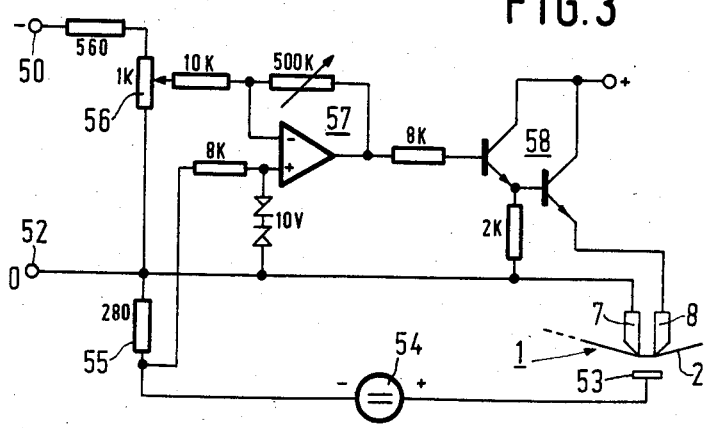
FIG. 4 is a diagram of an electrical temperature control circuit.

FIG. 4 is a circuit diagram for temperature-stabilisation in the case where the wire is heated by means of a heater circuit. Such a stabilisation may be necessary, for example, in order to minimize the effect of variations in the thermal contact between the wire and the supports on the temperature of the wire at the area of the emissive surface. An input terminal 50 of the circuit is connected to a reference voltage, and an input terminal 52 is connected to the source around. An emission current which is intercepted, for example, by an electrode 53 returns to the source 1 via a high voltage source 54 and is measured by way of a voltage drop thus caused across a resistor 55. This voltage drop is compared with a reference voltage which is derived by an adjustable voltage divider 56 from the reference voltage applied to the terminal 50. The difference voltage is amplified by a differential amplifier arrangement 57 in order to readjust the heater current by means of a control circuit 58. Instead of using the total emission current incident on the electrode 53, the stabilisation in a preferred embodiment is controlled by means of a local apertured electrode. The part of the emission current which is not effectively used in the apparatus is incident on the diaphragm. The opening of the aperture can be adapted to the shape of the emissive surface, but may also be circular in order to compensate for the non-circularity of the emissive surface. An aperture of this kind can also be used for realignment of the electron beam. To this end, the aperture is divided into two mutually electrically insulated portions. The boundary between these portions preferably extends in the direction of the metal wire in order to compensate for displacements thereof, or of the electron beam to be emitted by the wire, transversely of this direction. For adjustment in all directions, the aperture may be divided into four segments.

By including an electronic switch in the circuit, the source can also be made suitable for pulsed control. This may be advantageous, for example, when the source is used in an electron beam writing machine, because the electron beam can then be suppressed directly at the source, for example during the changing over to a new point to be irradiated on a chip or mask to be inscribed. An additional beam suppressor as usually included in this type of apparatus can then be dispensed with; the source load is then also lower and the risk of contamination of the source is reduced.

The described realignment of the beam by means of an aperture can also be used for realignment of the beam in the case where it is liable to be deflected by a magnetic field generated near the wire by the heater current. An a.c. power supply for the wire offers the advantage that the two supports are more symmetrically loaded; however in that case, disturbance of the beam by the alternating magnetic field must be prevented. Instead of heating by means of a heater current through the wire, it is alternatively possible to heat the metal wire locally by means of an energy beam which is directed thereon, for example an electron beam or ion beam generated in an auxiliary source, or an energy beam such as a laser beam. The supports then no longer serve as supply electrodes but retain their function of heat dissipation elements, as long as the construction of the supports made of a suitably thermally conductive material is not excessively small, an adequate amount of heat can usually be dissipated. The dissipation capacity can be influenced by the positioning of the supports and notably the positioning and properties of the parts of the apparatus which are to be arranged in the vicinity thereof. Should this capacity be insufficient, the supports can be shaped so that an increased thermal conductivity is realised. In order to reduce contamination of the inner surfaces of the supports, these surfaces can be shaped so that an angle beyond 90° occurs between each of said surfaces and the wire between the supports. These surfaces can be structured in order to avoid the occurrence of a continuous contamination layer thereon.

What is claimed is:

1. An electron beam apparatus comprising an electron source including an elongated thermal electron emissive element, said element being heated; and two supports spaced at most 1 mm apart of providing heat dissipation of said element, said element being displaceable under tension in the longitudinal direction between said two supports, wherein said element provides an electron emitting element, and said supports provide thermal equilibrium for said element.

2. An electron beam apparatus according to claim 1, wherein said emitting element is a wire-shaped element heated to a temperature near the melting point, and wherein said emitting element is transported with a tensile stress of at most 100 newton/mm$^2$ cross-section of the wire-shaped emitting element.

3. An electron beam apparatus according to claim 2, wherein said wire-shaped emitting element is accommodated into a cassette, said cassette being insertable into the apparatus.

4. An electron beam apparatus according to claim 1 or claim 2, wherein said emitting element has a flat cross-section between said two supports, said flat cross-section being imparted before passing between said supports.

5. An electron beam apparatus according to claim 4, wherein rolling means is included adjacent one of said two supports for moving said emitting element between said supports.

6. An electron beam apparatus according to claim 1 or claim 2, wherein said two supports include a guide groove for said emitting element, said guide groove being at ends of said two supports.

7. An electron beam apparatus according to claim 1 or claim 2, wherein said emitting element includes a length of wire not forming a closed loop, and wherein additional supporting devices are provided outside said two supports for providing electrically insulating elements.

8. An electron beam apparatus according to claim 1 or claim 2, wherein a temperature stabilization means is provided for stabilizing temperatures of said emitting element, said temperature stabilization means being controlled by an emission current in said emitting element.

9. An electron beam apparatus according to claim 8, wherein said temperature stabilization means also realigns an electron beam emitted by said electron source along a main axis of the apparatus.

10. An electron beam apparatus according to claim 9, wherein an apertured electrode being divided into segments is provided for intercepting emission current of said emitting element.

11. An electron beam apparatus according to claim 8, wherein an apertured electrode being divided into segments is provided for intercepting emission current of said emitting element.

12. An electron beam apparatus according to claim 1 or claim 2, wherein control circuit means are provided for controlling heat supply to said emitting element, said control circuit means providing pulsed heating of said emitting element.

13. An electron beam apparatus according to claim 1 or claim 2, wherein said two supports have inner surfaces angled beyond 90° to said emitting element between said two supports.

14. An electron beam apparatus according to claim 1 or claim 2, wherein said two supports have ends across which said emitting element extends.

15. An electron beam apparatus according to claim 1 or claim 2, wherein said two supports are spaced at 0.25 mm apart.

* * * * *